(12) United States Patent
Choi

(10) Patent No.: US 7,456,457 B2
(45) Date of Patent: Nov. 25, 2008

(54) LAYOUT OF SEMICONDUCTOR MEMORY DEVICE AND METHOD OF CONTROLLING CAPACITANCE OF DUMMY CELL

(75) Inventor: Jin Choi, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/296,843

(22) Filed: Dec. 6, 2005

(65) Prior Publication Data

US 2006/0138466 A1 Jun. 29, 2006

(30) Foreign Application Priority Data

Dec. 23, 2004 (KR) ............... 10-2004-0111169

(51) Int. Cl.
*H01L 27/108* (2006.01)
*H01L 29/94* (2006.01)

(52) U.S. Cl. .................. 257/296; 257/E27.084; 257/E27.085; 257/E25.023; 365/145; 365/149; 365/185.2; 365/210.1

(58) Field of Classification Search .......... 257/202, 257/208, 209, 211, 296, 908, 909, E27.084, 257/E27.085, E25.011, E25.012, E25.023
See application file for complete search history.

(56) References Cited

U.S. PATENT DOCUMENTS 5,682,343 A * 10/1997 Tomishima et al. .......... 365/63

6,333,870 B1 * 12/2001 Kang ................ 365/145
6,751,152 B2    6/2004 Hsu et al.
2004/0085844 A1 * 5/2004 Arimoto et al. ......... 365/210

FOREIGN PATENT DOCUMENTS

| KR | 1991-8925 | 10/1991 |
|---|---|---|
| KR | 1997-0008176 | 2/1997 |
| KR | 1999-23425 | 3/1999 |

OTHER PUBLICATIONS

English language abstract of Korean Publication No. 1997-0008176.
English language abstract of Korean Publication No. 1991-8925.
English language abstract of Korean Publication No. 1999-23425.

* cited by examiner

*Primary Examiner*—Minh-Loan Tran
*Assistant Examiner*—Leslie Pilar Cruz
(74) *Attorney, Agent, or Firm*—Marger Johnson & McCollom, P.C.

(57) ABSTRACT

Provided are a layout of a semiconductor memory device capable of minimizing an occupation area of a dummy cell array and a method of controlling capacitance of a dummy cell to be same with that of the memory cell. The layout includes a dummy cell connected to one side of a sense amplifier, in which the dummy cell has a capacitance identical to a capacitance of the memory cell. The dummy cell is connected to one side of a sense amplifier connected to the memory cell and arranged in a column direction of the semiconductor substrate.

17 Claims, 7 Drawing Sheets

LAYOUT OF SEMICONDUCTOR MEMORY DEVICE AND METHOD OF CONTROLLING CAPACITANCE OF DUMMY CELL

CROSS-REFERENCE TO RELATED PATENT APPLICATION

This application claims the benefit of Korean Patent Application No. 10-2004-0111169, filed on Dec. 23, 2004, in the Korean Intellectual Property Office, the disclosure of which is incorporated herein in its entirety by reference.

BACKGROUND OF THE INVENTION

1. Field of the Invention

The present invention relates to a semiconductor memory device and a method of manufacturing the same; and, more particularly, to a layout of a semiconductor memory device having a dummy cell and a method of controlling capacitance of the dummy cell.

2. Description of the Related Art

In a semiconductor memory, data is stored in a memory cell and is selectively read from the memory cell. The data read from the memory cell is transferred to a sense amplifier through a bit line. Then, the sense amplifier amplifies the data and determines a logic level of associated bit lines. Therefore, the bit line and the sense amplifier are essential elements for processing the data of the semiconductor memory device.

FIG. 1 is a plan view illustrating a layout of a semiconductor memory device having a conventional dummy cell.

Referring to FIG. 1, an edge portion of a memory device includes a dummy cell array (Array 00) which corresponds to a main cell array (Array 01), wherein a cell size and the number of cells per dummy bit line in the dummy cell array (Array 00) are identical to those in the main cell array (Array 01). The dummy cell array (Array 00) is used as a reference to detect the data stored in the main cell array (Array 01).

The semiconductor memory device having a dummy cell includes a plurality of memory cells 12, a plurality of sense amplifiers 18 and a plurality of dummy cells 20. The plurality of memory cells 12 for storing data are arranged in a row direction, i.e., x-axis, and a column direction, i.e., y-axis, on a semiconductor substrate 10. A plurality of bit lines 14 which extend in the row direction are perpendicularly intersected with a plurality of word lines 16 extending in the column direction. The plurality of sense amplifiers 18 connected to the plurality of bit lines 14 are arranged in the column direction with respect to the semiconductor substrate. That is, the plurality of bit lines 14 are connected to one end of each plurality of sense amplifiers 18 and are extended in the row direction.

The plurality of dummy cells 20 are connected to a plurality of dummy bit lines 22 and are extended in an opposite direction to the plurality of bit lines 14, wherein the plurality of sense amplifiers 18 are disposed between the plurality of dummy bit lines 22 and the plurality of bit lines 14. Herein, the number of memory cells 12 is identical to the number of dummy cells 20. Meanwhile, the dummy cell array (Array 00) occupies a predetermined area in the edge portion of the memory device. In order to reduce the occupation area of the dummy cell array (Array 00), various attempts have been made. For example, it is possible to arrange a pair of neighboring dummy cells in the dummy cell array (Array 00) as illustrated in FIG. 1. However, despite various efforts, dummy cell arrays (e.g. Array 00) typically occupy more than about 1.5% of the total area of a memory device.

Accordingly, a more efficient use of space on a semiconductor substrate for a memory device is desired.

SUMMARY OF THE INVENTION

The present invention has an advantage in minimizing an occupation area of a dummy cell array.

The present invention also includes the advantage of equalizing the capacitance of a dummy cell with a memory cell.

"According to an aspect of the present invention, there is provided a layout of a semiconductor memory device, including: a semiconductor substrate; a plurality of memory cells storing data, the plurality of memory cells being arranged in row and column directions on the semiconductor substrate; a sense amplifier connected to at least one of the memory cells, the sense amplifier being arranged in the column direction of the semiconductor substrate; a bit line connected to one side of the sense amplifier, the bit line being extended in the row direction; and a dummy cell connected to one side of the sense amplifier, the dummy cell having a capacitance identical to a capacitance of the associated memory cell bit line row."

The dummy cell may include: a plurality of cell capacitors, each cell capacitor being provided with a bottom electrode, a dielectric layer and a top electrode; a bottom electrode contact formed under said cell capacitor; a first dummy contact spaced apart from the bottom electrode contact by a predetermined distance and electrically connected to the bottom electrode contact; and a dummy bit line electrically connected to the first dummy contact.

The plurality of cell capacitors may be interconnected in parallel.

The dummy cell may include: a MOS capacitor provided with the semiconductor substrate, a gate insulating layer and a gate electrode; and a second dummy contact formed spaced apart from the MOS capacitor and electrically connected to the MOS capacitor.

The dummy cell may be electrically opened from the bit line.

A capacitance of the dummy cell may be in a range of 40 fF to 100 fF.

According to another aspect of the present invention, there is provided a layout of a semiconductor memory device, including: a semiconductor substrate; a plurality of memory cells storing data, the plurality of memory cells being arranged in row and column directions on the semiconductor substrate; a sense amplifier connected to the memory cell and arranged in the column direction of the semiconductor substrate; a bit line connected to one side of the sense amplifier and extended in the row direction; and a dummy cell arranged in an opposite to the memory cell, the dummy cell having a capacitance identical to a capacitance of the memory cell, wherein the sense amplifier is disposed between the dummy cell and the memory cell.

The dummy cell may be arranged opposite to the bit line, the sense amplifier being interposed therebetween.

According to a further another aspect of the present invention, there is provided a layout of a semiconductor memory device, including: a semiconductor substrate; a plurality of memory cells storing data, the plurality of memory cells being arranged in row and column directions on the semiconductor substrate; a sense amplifier connected to the memory cell and arranged in the column direction of the semiconductor substrate; a bit line connected to one side of the sense amplifier and extended in the row direction; and a dummy cell disposed between the sense amplifier and the memory cell, the dummy cell having a capacitance identical to a capacitance of the memory cell.

The same number of capacitors may be arranged in the dummy cell and disposed between a neighboring bit line pair and the sense amplifier.

According to a still further another aspect of the present invention, there is provided a method of controlling capacitance of a dummy cell, the method including: setting capacitance of each memory cell storing data, the each memory being arranged in row and column directions; and forming a dummy cell having a capacitance identical to a capacitance of the memory cell, the dummy cell being connected to one side of a sense amplifier connected to the memory cell and being arranged in the column direction of a semiconductor substrate.

The forming of the dummy cell may include: forming a first interlayer dielectric layer covering a conductive pad formed on the semiconductor substrate; forming a first dummy contact connected electrically to one end of the conductive pad; forming a dummy bit line connected to the first dummy contact, the dummy bit line being extended in a row direction with respect to the semiconductor substrate; forming a second interlayer dielectric layer on the first interlayer dielectric layer and the dummy bit line; forming a bottom electrode contact connected electrically the other end of the conductive pad; and forming a cell capacitor connected to the bottom electrode contact, the cell capacitor having a stacked structure of a bottom electrode, a dielectric layer and a top electrode, which are formed in sequence.

After the forming of the dummy cell, the method may further include forming a MOS capacitor having a gate insulator on the semiconductor substrate and a gate electrode formed on the gate insulator.

The forming of the MOS capacitor may include: forming a MOS capacitor having a gate insulator on the semiconductor substrate where a conductive region is formed, and a gate electrode on the gate insulator; forming a first interlayer dielectric layer covering the MOS capacitor; forming a second contact and a second dummy contact through the first interlayer dielectric layer, the second contact being electrically connected to one end of the conductive region, the second dummy contact being connected to a top face of the gate electrode; and forming a dummy bit line connected to the second dummy contact and extended in the row direction with respect to the semiconductor substrate.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

The embodiments of the present invention are related to an arrangement of a plurality of capacitors that are connected to a dummy bit line 208, in order that capacitance per the dummy bit line 208 in a dummy cell array (Array 00) may be identical to capacitance of each memory cell. Following first and second embodiments will be classified and described in detail according to various methods for arranging the plurality of capacitors.

Embodiment 1

Figure 1:
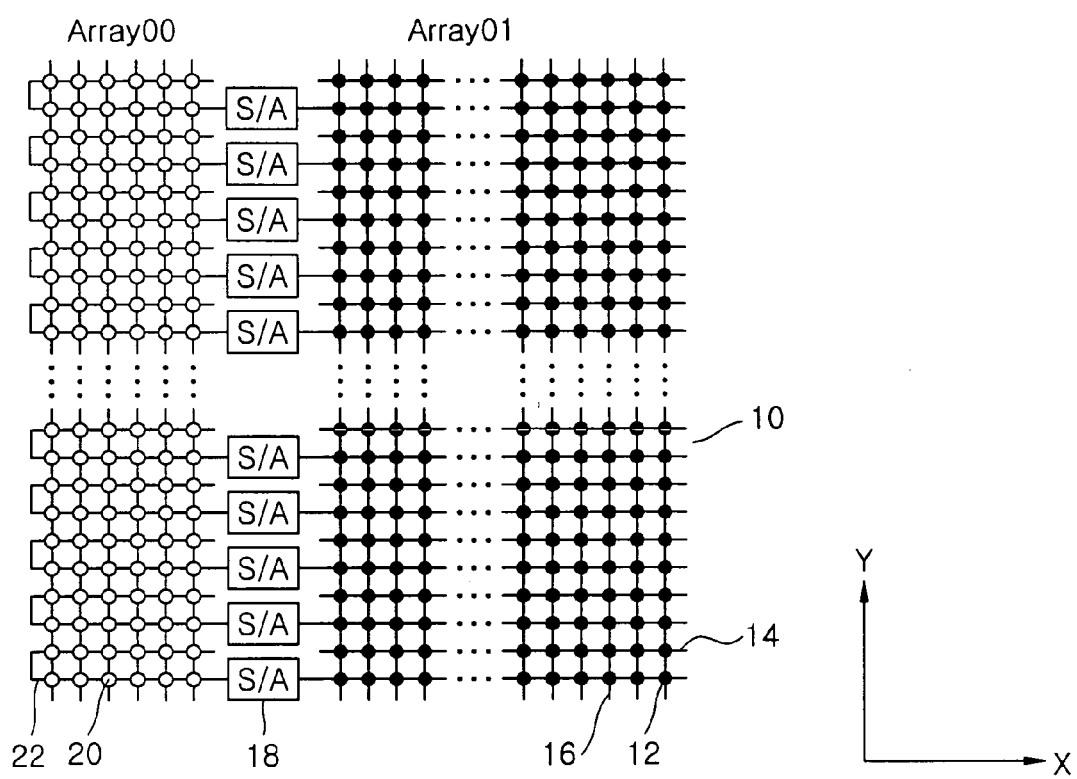
FIG. 1 is a plan view illustrating a layout of a semiconductor memory device having a conventional dummy cell.
Figure 2:
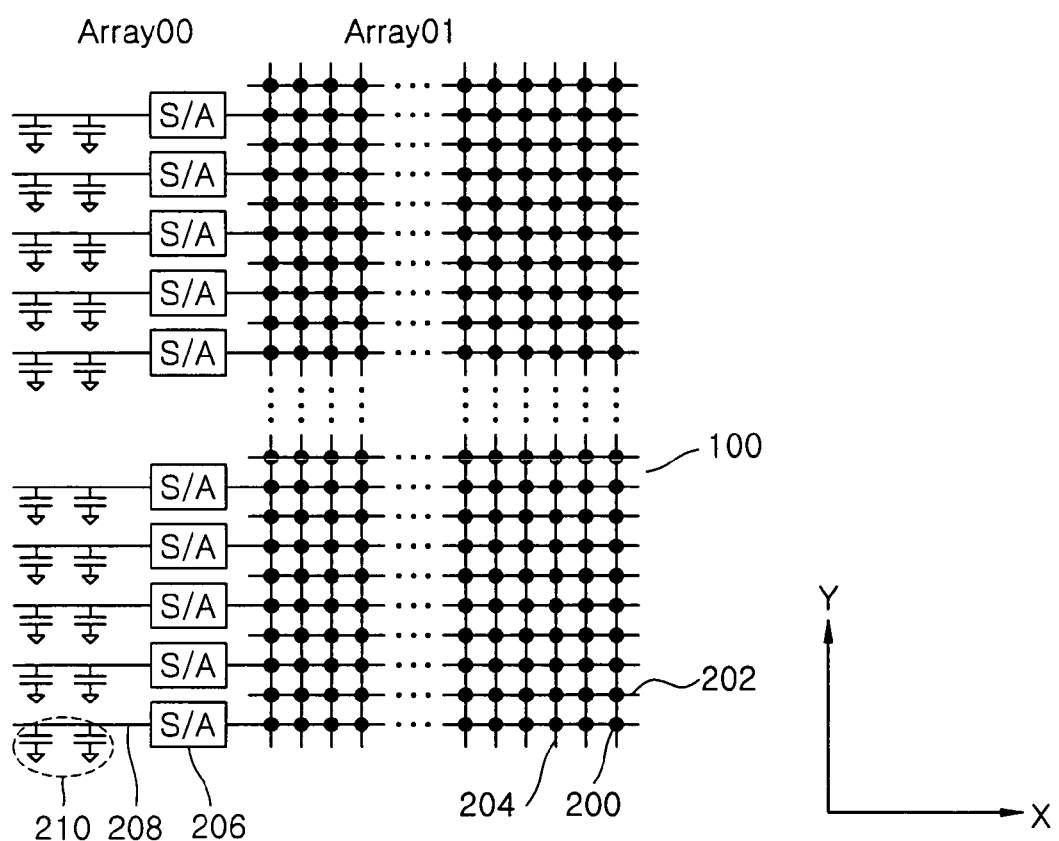
FIG. 2 is a plan view illustrating a layout of a semiconductor memory device having a dummy cell according to a first preferred embodiment of the present invention.

FIG. 2 is a plan view illustrating a layout of a semiconductor memory device having a dummy cell according to a first preferred embodiment of the present invention. Though the first embodiment of the present invention is related to the memory device having a dummy cell array (Array 00) and a main cell array (Array 01), illustrations for the first embodiment will be focused on one sense amplifier for the sake of convenience.

Referring to FIG. 2, a semiconductor memory device includes a memory cell 200, a sense amplifier 206 and a dummy cell 210. The memory cells that stores data are arranged in row and column directions on a semiconductor substrate 100. A bit line 202 extending in the row direction is perpendicularly intersected with a word line 204 extending in the column direction. One sense amplifier 206 is connected to one bit line 202 and is arranged in the column direction with respect to the semiconductor substrate 100. That is, the bit line 202 is connected to one side of the sense amplifier 206 and is extended in the row direction.

The dummy cell 210 connected to the dummy bit line 208 is extended in an opposite direction to the bit line 202, wherein the sense amplifier is interposed between the dummy cell 210 and the bit line 202. A plurality of capacitors may be electrically connected to the dummy bit line 208 in parallel according to the present invention. The plurality of capacitors may be classified into cell capacitors and MOS capacitors, which will be illustrated in detail in FIGS. 3 to 7. The dummy cell 210 may be electrically opened from the bit line 202. In addition, a capacitance of the dummy cell 210 may be in a range of 40 fF to 60 fF, which may be changed according to a kind of memory device.

Figure 3:
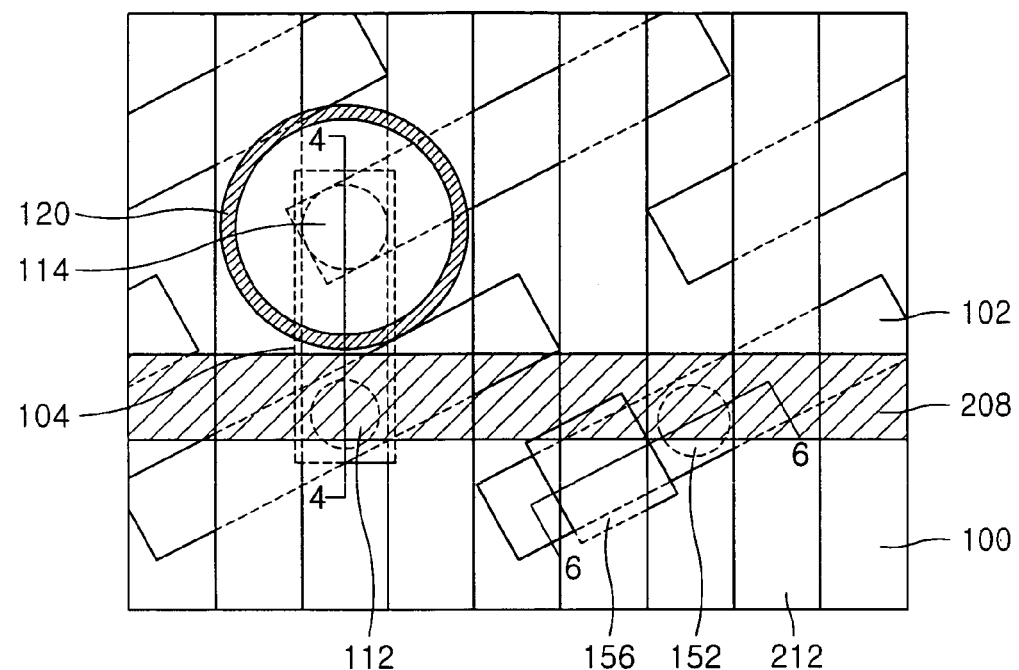
FIG. 3 is a plan view illustrating a predetermined part of the dummy cell having the plurality of capacitors according to the first preferred embodiment of the present invention.

FIG. 3 is a plan view illustrating a predetermined part of the dummy cell 210 having the plurality of capacitors introduced in the first preferred embodiment. Herein, FIG. 3 illustrates the capacitors for illustrative purposes so that the capacitors may be embodied in many different forms such as an active area 102 or the other forms corresponding to every kind of memory device. Furthermore, a method of arranging the capacitors connected to the dummy bit line 208 should not be construed as being limited to FIG. 3 and various methods may be employed. FIG. 3 illustrates for illustrative purpose only the memory device having an inclined active area 102.

Referring to FIG. 3, the dummy bit line 208 extending in a row direction is perpendicularly intersected with a plurality of word lines 212 extending in a column direction. One dummy bit line 208 may be connected to only one sense amplifier 206 (FIG. 2). The semiconductor substrate 100 incorporates therein an inclined active area 102 having a predetermined slope angle with respect to the dummy bit line 208. The dummy bit line 208 may include at least one cell capacitor that is depicted as denotation 130 of FIG. 5 and at least one MOS capacitor that is depicted as denotation 158 of FIG. 6, wherein the cell capacitor and the MOS capacitor are interconnected in parallel. The cell capacitor shown in FIG. 3 is one where only the bottom electrode 120 has been completed for the sake of convenience.

Figure 4:
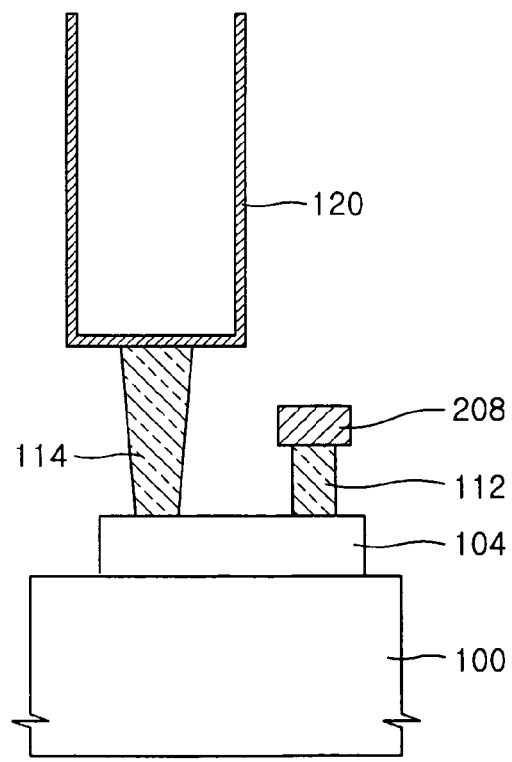
FIG. 4 is a cross sectional view taken along line 4-4 of FIG. 3.
Figure 5:
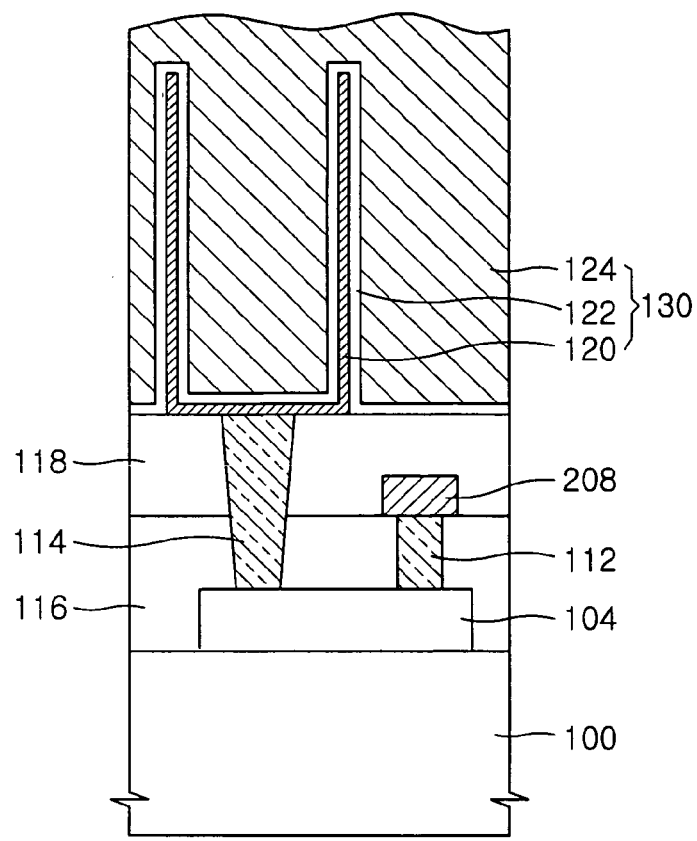
FIG. 5 is another cross sectional view illustrating a part of the cell capacitor after completing processes.

FIGS. 4 and 5 are cross-sectional views illustrating the cell capacitor 130 of the dummy cell 210. In more detail, FIG. 4 is a cross-sectional view taken along line 4-4 of FIG. 3 and FIG. 5 is another cross sectional view illustrating a part of the cell capacitor 130 in which the manufacturing process has been completed.

Referring to FIGS. 4 and 5, the dummy cell 210 includes a cell capacitor 130, a bottom electrode contact 114, a first dummy contact 112 and a dummy bit line 208. In order to form the dummy bit line 208, a first interlayer dielectric layer 116 is formed over a semiconductor substrate 100 and a conductive pad 104, wherein the first interlayer dielectric layer covers the conductive pad 104. The conductive pad 104 may use conductive material selected from the group consisting of Al, Cu, W, Ti, Ta, metal nitride, metal silicide, polysilicon and a combination thereof. The conductive pad 104 may be formed by using a conventional photolithographic process or a self-aligned process. Afterwards, the first dummy contact 112 is formed using a conventional method so that it is connected to one end of the conductive pad 104. Thereafter, the dummy bit line 208 of a bar type, which is extended in the row direction with respect to the substrate 100, is formed on the first interlayer dielectric layer 116 and the first dummy contact 112. In some cases, the dummy bit line 208 may be formed using a conductive area of impurities (not shown) in the semiconductor substrate 100 without a supplementary formation of the conductive pad 104.

The cell capacitor 130 may be a stacked structure where the bottom electrode 120, a dielectric layer 122 and a top electrode 124 are subsequently formed. In order to form the cell capacitor 130, a second interlayer dielectric layer 118 is formed on the first interlayer dielectric layer 116 and exposed surfaces of the dummy bit line 208. Thereafter, the bottom electrode contact 114 is formed through the first and the second interlayer dielectric layers 116 and 118, which are electrically connected to the other end of the conductive pad 104. The bottom electrode contact 114 may be formed using a conventional lithographic process. Upon the second interlayer dielectric layer 118, the bottom electrode 120, the dielectric layer 122 and the top electrode 124 are formed subsequently to be connected to the bottom electrode contact 114, thereby forming the cell capacitor 130.

In case that the plurality of cell capacitors 130 are connected to the dummy bit line 208, each of the cell capacitors 130 is connected to the dummy bit line 208 in parallel. In this case, an equivalent capacitance of the plurality of cell capacitors 130 is as a summation of each capacitance of the cell capacitor 130. Therefore, it is possible to adjust the capacitance of the dummy cell 210 by controlling the number of the cell capacitors 130 connected in parallel. According to the first embodiment of the present invention, it is preferable that the capacitance of one cell capacitor 130 should be controlled to be in a range of about 15 fF to about 25 fF.

Figure 6:
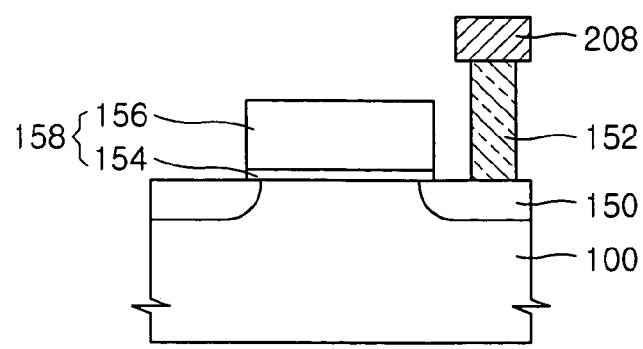
FIG. 6 is a cross sectional view taken along line 6-6 of FIG. 3.
Figure 7:
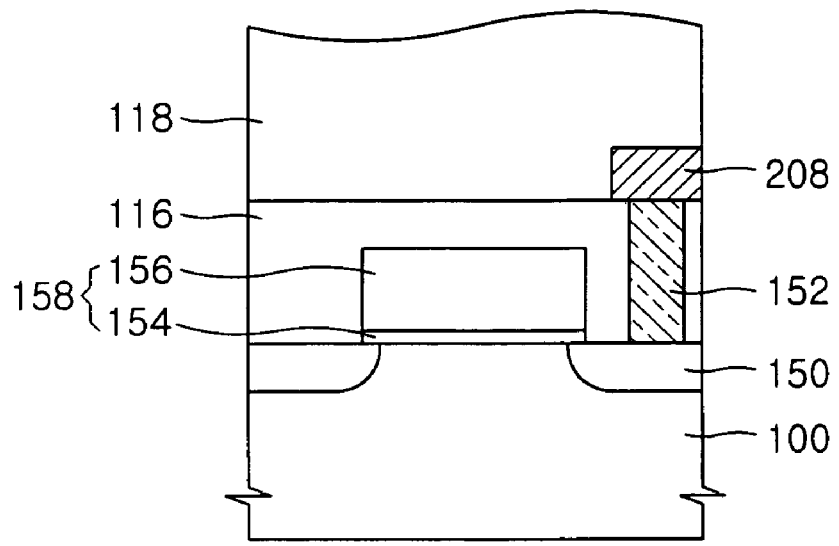
FIG. 7 is another cross sectional view of the dummy cell in which the MOS capacitor has been completed.

FIGS. 6 and 7 are cross-sectional views illustrating the MOS capacitor 158 of the dummy cell 210. In particular, FIG. 6 is a cross-sectional view taken along line 6-6 of FIG. 3 and FIG. 7 is another cross sectional view of the dummy cell 210 where the MOS capacitor 158 has been formed.

Referring to FIGS. 6 and 7, the dummy cell 210 having the MOS capacitor 158 includes a MOS capacitor 158, a second dummy contact 152 and a dummy bit line 208. The MOS capacitor 158 is provided with a gate insulating layer 154 and a gate electrode 156, which are formed on the semiconductor substrate 100 where a conductive region 150 is formed. The conductive region 150 may employ the conductive pad 104 that has been illustrated already in forming the cell capacitor 130. An overlapped area between the conductive area 150 and the MOS capacitor 158 can be determined according to a desired capacitance. In other words, as the overlapped becomes larger, the capacitance of the MOS capacitor 158 increases more.

After forming the MOS capacitor 158, a first interlayer dielectric layer 116 is formed to cover the MOS capacitor 158. The first interlayer dielectric layer 116 may be identical to the first dielectric layer 116 shown in FIG. 5. As a result, the cell capacitor 130 and the MOS capacitor 158 may be simultaneously formed through the same process. Afterwards, a second dummy contact 152 is formed through the first dielectric layer 116 so as to be electrically connected to one of the conductive region 150. Upon a predetermined location of the first interlayer dielectric layer 116, the dummy bit line 208 of a bar type that is extended in the row direction with respect to the substrate 100 is formed on the first interlayer dielectric layer 116 and the second dummy contact 152.

Thereafter, a second interlayer dielectric layer 118 is formed on the first interlayer dielectric layer 116 and the dummy bit line 208. Though not shown in the drawings, an interconnection contact is formed through predetermined locations of the first and the second interlayer dielectric layers 116 and 118 in order that the gate electrode 156 may be connected to an external circuit. The interconnection contact is connected to an upper face of the gate electrode 156.

In case that the plurality of MOS capacitors 158 are connected to the dummy bit line 208, each MOS capacitor 158 is connected to the dummy bit line 208 in parallel. In this case, the equivalent capacitance of the MOS capacitors is a summation of each capacitance of the MOS capacitor 158. Accordingly, it is possible to adjust the capacitance of the dummy cell 210 by controlling the number of the MOS capacitors 158 connected in parallel. The capacitance of one MOS capacitor 158 may be controlled to be in a range of about 15 fF to 25 fF.

Figure 8:
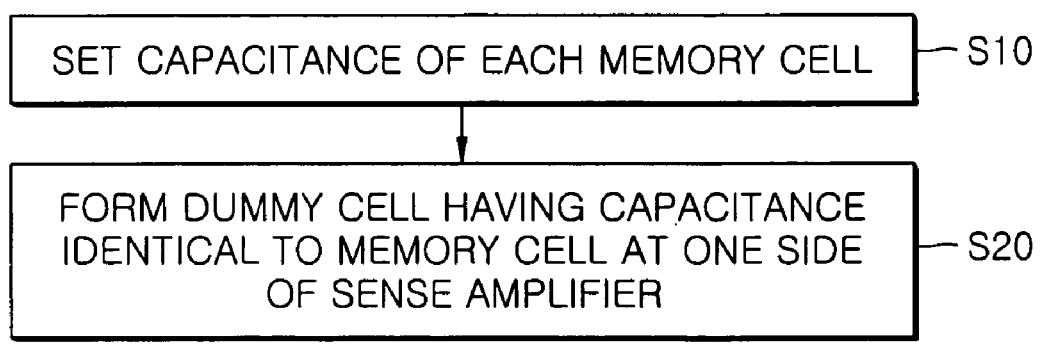
FIG. 8 is a flowchart illustrating a method of controlling the capacitance of the dummy cell according to the present invention.

A method of controlling the capacitance of the dummy cell 210 according to the first embodiment of the present invention will now be described in detail. FIG. 8 is a flowchart illustrating a method of controlling the capacitance of the dummy cell 210 according to the present invention.

Referring to FIG. 8, in operation S10, a capacitance of each memory cell arranged in row and column directions on the semiconductor substrate 100 is set in advance. At this time, the capacitance of the memory cell 200 in the main cell array (Array 01) may be set during a circuit design or may be set using the capacitance measured from the actual memory cell 200. Afterwards, in operation S20, the dummy cell 210 is formed at one side of the sense amplifier 206, wherein the capacitance of the dummy cell 210 is identical to that of the associated memory cell 200 bit line row.

For instance, provided that the capacitance of the memory cell 200 is about 60 fF, that of the cell capacitor 130 is about 25 fF and that of the MOS capacitor 158 is about 10 fF, it is possible to embody the dummy cell having two cell capacitors 130 and one MOS capacitors 158.

Accordingly, there are required only two or three capacitors for structuring the dummy cell 210. As a result, it is possible to remarkably reduce the occupation area of the dummy cell 210 in comparison with the prior art.

Embodiment 2

In this embodiment, the cell capacitor 130 and the MOS capacitor 158 of the dummy cell 210 and the method of controlling the capacitance of the dummy cell 210 are identical to those of the first embodiment as depicted in FIGS. 3 to 8.

Figure 9:
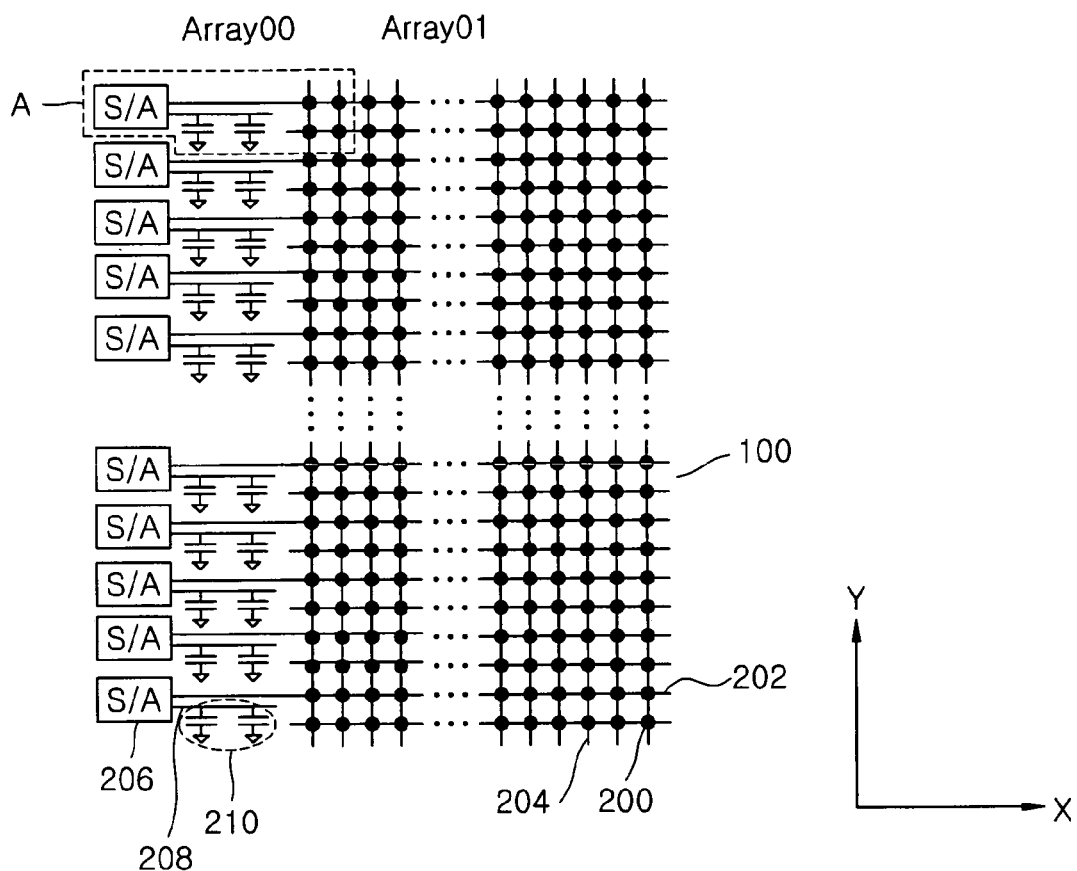
FIG. 9 is a plan view illustrating a layout of a semiconductor memory device having a dummy cell according to a second preferred embodiment of the present invention.

FIG. 9 is a plan view illustrating a layout of a semiconductor memory device having a dummy cell according to a second preferred embodiment of the present invention. Descriptions for the second embodiment will be set forth on the basis of one sense amplifier 206 like the first embodiment of the present invention.

Referring to FIG. 9, the semiconductor memory device having a dummy cell includes a memory cell 200, a sense amplifier 206 and a dummy cell 210. The memory cell that stores data is arranged in row and column directions on a semiconductor substrate 100. A bit line 202 extending in the row direction is perpendicularly intersected with a word line 204 extending in the column direction. One sense amplifier 206 is connected to one bit line 202 and is arranged in the column direction with respect to the semiconductor substrate 100. That is, the bit line 202 is connected to one side of the sense amplifier 206 and is extended in the row direction.

The dummy cell 210 is disposed between the sense amplifier 206 and the memory cell 200. That is, the dummy cell 210 of the second embodiment is disposed in an opposite direction with respect to the sense amplifier 206, which is different from the first embodiment. Meanwhile, a process of forming an outermost part of the memory device is stable. Thus, provided that the sense amplifier 206 is disposed at the outermost part, the process of forming the dummy cell 210 is stable to thereby secure process continuity. In addition, like the first embodiment, a plurality of capacitors may be connected to the dummy bit line 208 in parallel.

Figure 10:
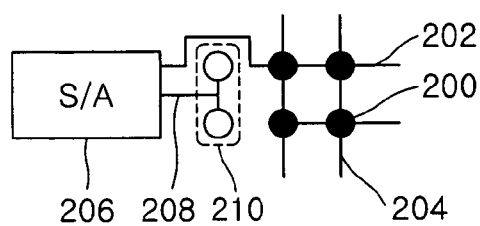
FIGS. 10 and 11 are plan views illustrating an arrangement of a capacitor in the dummy cell according to the second preferred embodiment of the present invention.
Figure 11:
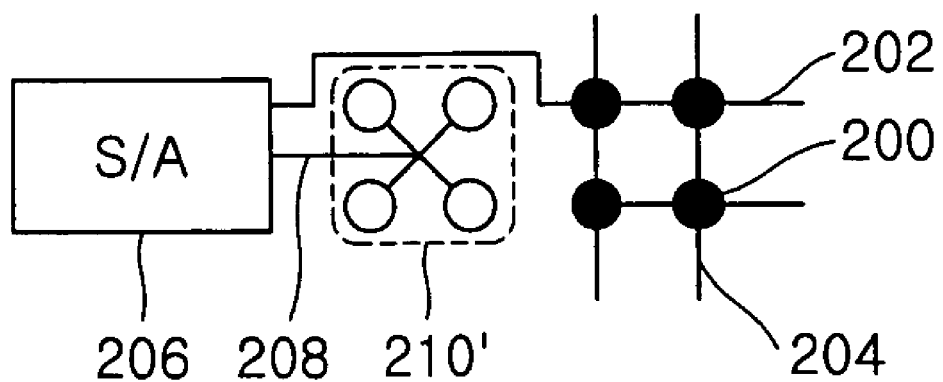

At this time, for an optimized arrangement shown as a portion A of FIG. 9, it is preferable that the plurality of capacitors of the dummy cell 210 may be arranged in the column direction with respect to the semiconductor substrate 100 and may be connected to one side of the sense amplifier 206. Lengthwise connection of dummy cell capacitors along a row is space inefficient as it requires a longer bit line from the memory cells. This results in an increase of an unnecessary area at a neighboring bit line pair 202. Therefore, as shown in FIGS. 10 and 11, the capacitors are preferably arranged between the neighboring bit line pair 202 and the sense amplifier 206 in columns and connected in parallel rather than series. A denotation of O represents the capacitor.

Provided that the number of capacitors for the dummy cell is two, each capacitor should be arranged between the sense amplifier 206 and the neighboring bit line pair 202. In the case of three capacitors, two capacitors are arranged between the sense amplifier 206 and the neighboring bit line pair 202 and the dummy bit line 208 is connected to three capacitors. If the number of capacitors is four, four capacitors are connected to each other by means of the dummy bit line 208, as depicted in FIG. 11.

If four capacitors are arranged in a line, the neighboring bit line 202 is extended as much as the dummy bit line 208 to which the four capacitors are connected. This results in an inefficient use of space compared with a layout of FIG. 11. Accordingly, it is possible to minimize the occupation area of dummy cell 210' according to the inventive layout.

As described above, since the dummy cell can be formed using only two or three capacitors by virtue of the layout of the semiconductor memory device, it is possible to minimize the occupation area of the dummy cell in the semiconductor memory device.

In addition, the capacitance of the dummy cell can be controlled in a same manner with that of the memory cell so that it is possible to easily form the dummy cell.

Furthermore, provided that the dummy cell is arranged between the memory cell and the sense amplifier, the process of forming the dummy cell is stable to thereby secure process continuity.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A layout of a semiconductor memory device, comprising:
    a semiconductor substrate;
    a plurality of memory cells storing data, the plurality of memory cells being arranged in row and column directions on the semiconductor substrate to form a plurality of rows and columns;
    a sense amplifier connected to at least an associated one of the plurality of rows of memory cells to comprise a plurality of sense amplifiers, the sense amplifiers being arranged in the column direction of the semiconductor substrate;
    a bit line connected to each sense amplifier, the bit line being extended in the row direction; and
    for each sense amplifier, a dummy cell connected to the sense amplifier, the dummy cell having a capacitance identical to a capacitance of the row of memory cells associated with the same sense amplifier.

2. The layout of claim 1, wherein the dummy cell includes:
    a plurality of cell capacitors, each cell capacitor being provided with a bottom electrode, a dielectric layer and a top electrode;
    a bottom electrode contact formed under said cell capacitor;
    a first dummy contact spaced apart from the bottom electrode contact by a predetermined distance and electrically connected to the bottom electrode contact; and
    a dummy bit line electrically connected to the first dummy contact.

3. The layout of claim 2, wherein the plurality of cell capacitors are interconnected in parallel.

4. The layout of claim 2, wherein the dummy cell includes:
    a MOS capacitor provided with the semiconductor substrate, a gate insulating layer and a gate electrode; and
    a second dummy contact formed spaced apart from the MOS capacitor and electrically connected to the MOS capacitor.

5. The layout of claim 1, wherein the dummy cell is electrically opened from the bit line.

6. The layout of claim 1, wherein capacitance of the dummy cell is in a range of 40 fF to 100 fF.

7. A layout of a semiconductor memory device, comprising:
a semiconductor substrate;
a plurality of memory cells storing data, the plurality of memory cells being arranged in row and column directions on the semiconductor substrate to form a plurality of rows and columns;
a sense amplifier connected to at least an associated one of the plurality of rows of memory cells to comprise a plurality of sense amplifiers, the sense amplifiers being arranged in the column direction of the semiconductor substrate;
a bit line connected to one side of each sense amplifier, the bit line being extended in the row direction; and
for each sense amplifier, a dummy cell having a capacitance identical to a capacitance of the row of memory cells associated with the same sense amplifier, wherein the sense amplifier is disposed between the dummy cell and the memory cell.

8. The layout of claim 7, wherein the dummy cell includes:
a plurality of cell capacitors, each cell capacitor being provided with a bottom electrode, a dielectric layer and a top electrode;
a bottom electrode contact formed under the cell capacitor;
a first dummy contact spaced apart from the bottom electrode contact by a predetermined distance and electrically connected to the bottom electrode contact; and
a dummy bit line electrically connected to the first dummy contact.

9. The layout of claim 8, wherein the plurality of cell capacitors are interconnected in parallel.

10. The layout of claim 8, wherein the dummy cell includes:
a MOS capacitor provided with the semiconductor substrate, a gate insulating layer and a gate electrode; and
a second dummy contact formed spaced apart from the MOS capacitor and electrically connected to the MOS capacitor.

11. The layout of claim 7, wherein the dummy cell is arranged in opposite to the bit line, the sense amplifier being interposed therebetween.

12. A layout of a semiconductor memory device, comprising:
a semiconductor substrate;
a plurality of memory cells storing data, the plurality of memory cells being arranged in row and column directions on the semiconductor substrate;
a sense amplifier connected to each row of memory cells to comprise a plurality of sense amplifiers, the sense amplifiers being arranged in the column direction of the semiconductor substrate;
a bit line connected to one side of each sense amplifier, the bit line being extended in the row direction; and
for each sense amplifier, a dummy cell disposed between the sense amplifier and the row of memory cells connected to the sense amplifier, the dummy cell having a capacitance identical to a capacitance of the row of memory cells associated with the same sense amplifier.

13. The layout of claim 12, wherein the dummy cell includes:
a plurality of cell capacitors, each cell capacitor being provided with a bottom electrode, a dielectric layer and a top electrode;
a bottom electrode contact formed under the cell capacitor;
a first dummy contact spaced apart from the bottom electrode contact by a predetermined distance and electrically connected to the bottom electrode contact; and
a dummy bit line electrically connected to the first dummy contact.

14. The layout of claim 13, wherein the plurality of cell capacitors are interconnected in parallel.

15. The layout of claim 13, wherein the dummy cell includes:
a MOS capacitor provided with the semiconductor substrate, a gate insulating layer and a gate electrode; and
a second dummy contact formed spaced apart from the MOS capacitor and electrically connected to the MOS capacitor.

16. The layout of claim 12, wherein the capacitors are arranged in the dummy cell in the column direction with respect to the semiconductor substrate.

17. The layout of claim 16, wherein the same number of capacitors are disposed between a neighboring bit line pair and the sense amplifier.

* * * * *